(12) United States Patent
Lin et al.

(10) Patent No.: US 11,923,391 B2
(45) Date of Patent: Mar. 5, 2024

(54) MOIRÉ PATTERN IMAGING DEVICE (71) Applicant: inFilm Optoelectronic Inc., Grand Cayman (KY)

(72) Inventors: Chih-Hsiung Lin, Grand Cayman (KY); Jung-Ping Liu, Grand Cayman (KY)

(73) Assignee: SHAANXI YIXIAN XIER INTELLIGENT OPTOELECTRONICS CO., LTD, Xianyang (CN)

( * ) Notice: Subject to any disclaimer, the term of this patent is extended or adjusted under 35 U.S.C. 154(b) by 168 days.

(21) Appl. No.: 17/339,386

(22) Filed: Jun. 4, 2021

(65) Prior Publication Data

US 2022/0020798 A1 Jan. 20, 2022

(30) Foreign Application Priority Data

Jul. 17, 2020 (CN) .......................... 202010692476.1

(51) Int. Cl.
*H01L 27/146* (2006.01)
*G02B 27/60* (2006.01)
(52) U.S. Cl.
CPC ........ *H01L 27/14623* (2013.01); *G02B 27/60* (2013.01); *H01L 27/14627* (2013.01)

(58) Field of Classification Search
CPC ......... H01L 27/14623; H01L 27/14625; H01L 27/14627; G02B 27/60; G02B 3/0006; G02B 3/0037; G02B 3/005; G02B 3/08
See application file for complete search history.

(56) References Cited

U.S. PATENT DOCUMENTS

| 2009/0034082 | A1* | 2/2009 | Commander | .......... G02B 27/60 |
| | | | | 427/160 |
| 2021/0271003 | A1* | 9/2021 | Yang | ...................... G06V 40/12 |

* cited by examiner

*Primary Examiner* — Nelson Garces
(74) *Attorney, Agent, or Firm* — RABIN & BERDO, P.C.

(57) ABSTRACT

A moiré pattern imaging device includes a light-transmissive film and a light-shielding film. The light-transmissive film includes a plurality of imaging units and a light-incident surface and a light-emergent surface opposite to each other. The plurality of imaging units are disposed on the light-incident surface, the light-emergent surface, or a combination thereof and are arranged in two dimensions to form an imaging unit array. The light-shielding film includes a plurality of light-transmissive regions. The light-transmissive regions are arranged in two dimensions to form a light-transmissive array, and the light-shielding film is overlaid on the light-incident surface or the light-emergent surface. The light-transmissive array corresponds to the imaging unit array. The imaging unit array and the light-transmissive array together form a moiré pattern effect to generate an image magnification effect.

10 Claims, 9 Drawing Sheets

MOIRÉ PATTERN IMAGING DEVICE

CROSS-REFERENCE TO RELATED APPLICATION

This non-provisional application claims priority under 35 U.S.C. § 119(a) to Patent Application No. 202010692476.1 filed in China, P.R.C. on Jul. 17, 2020, the entire contents of which are hereby incorporated by reference.

BACKGROUND

Technical Field

The instant disclosure relates to an imaging device, and in particular, to a moiré pattern imaging device.

Related Art

With the rapid development of multimedia technologies, numerous electronic devices (such as smartphones, tablet computers, notebook computers, digital cameras, or the like) are equipped with an optical lens module. For example, the optical lens module may be a wide-angle lens module, a fisheye lens module, a zoom lens module, or the like to support functions such as photography, network video communication, facial recognition, or the like.

However, current optical lens modules on the market are generally composed of a plurality of optical lenses such as concave lenses or convex lenses. As a result, the optical lens modules cannot be further thinned. For example, optical lens modules of smartphones and tablet computers usually have a thickness more than 5 mm, and optical lens modules of digital cameras usually have a thickness more than 50 mm, impeding thinning of electronic devices.

SUMMARY

In view of the above, in an embodiment, a moiré pattern imaging device is provided, including a light-transmissive film and a light-shielding film. The light-transmissive film includes a plurality of imaging units and a light-incident surface and a light-emergent surface opposite to each other. The plurality of imaging units are disposed on the light-incident surface, the light-emergent surface, or a combination thereof and are arranged in two dimensions to form an imaging unit array. The light-shielding film includes a plurality of light-transmissive regions. The light-transmissive regions are arranged in two dimensions to form a light-transmissive array, and the light-shielding film is overlaid on the light-incident surface or the light-emergent surface. The light-transmissive array corresponds to the imaging unit array. The imaging unit array and the light-transmissive array together form a moiré pattern effect to generate an image magnification effect.

As above, according to the moiré pattern imaging device in the embodiments of the instant disclosure, the imaging unit array is disposed on the light-transmissive film and the light-transmissive array is disposed on the light-shielding film, and a moiré pattern effect can be generated between the imaging unit array of the light-transmissive film and the light-transmissive array of the light-shielding film, thereby achieving an image magnification effect. In this way, the moiré pattern imaging device may be overall designed to be much thinner than current optical lens modules on the market.

DETAILED DESCRIPTION

Various embodiments are described in detail below. However, the embodiments are merely used as examples for description and do not limit or reduce the protection scope of the instant disclosure. In addition, some elements are omitted in the drawings of the embodiments to clearly show the technical features of the instant disclosure. The same reference numeral is used to indicate the same or similar elements in all of the drawings.

Figure 1:
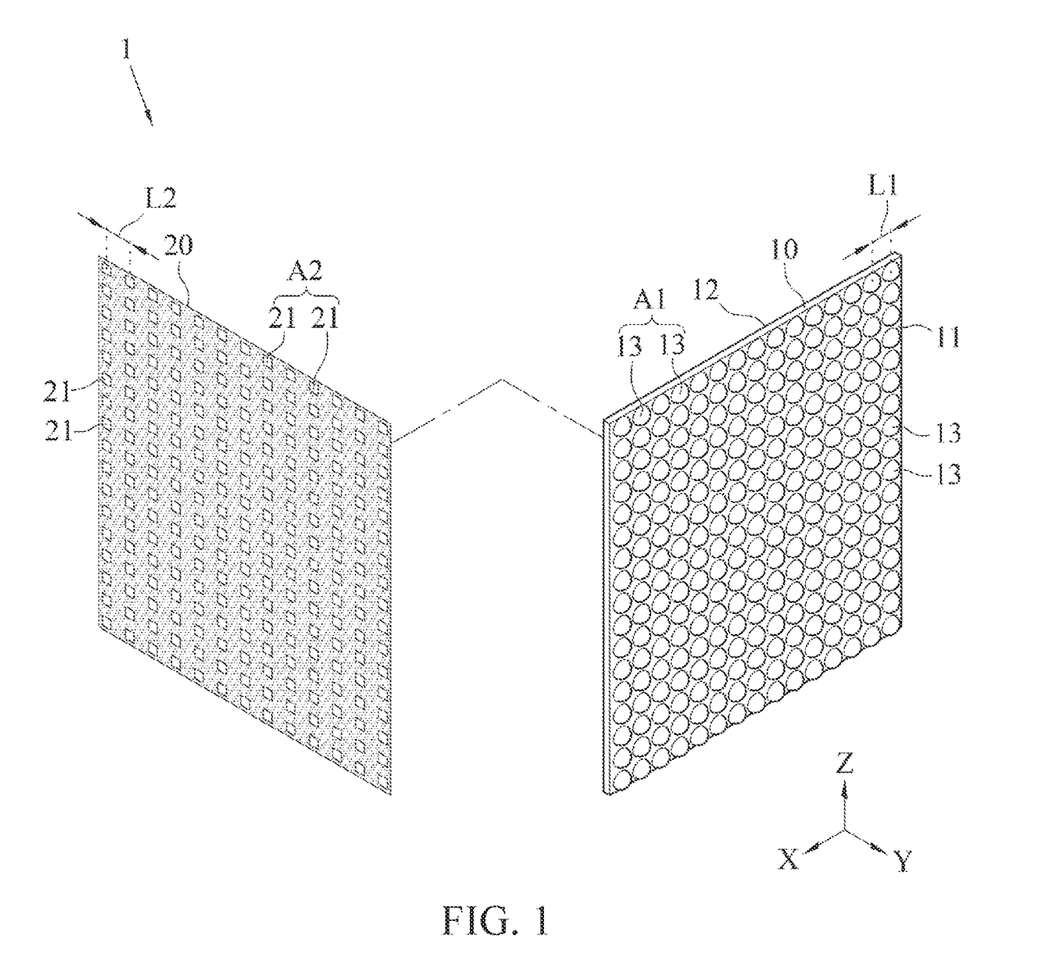
FIG. 1 illustrates a three-dimensional exploded view of an embodiment of a moiré pattern imaging device according to the instant disclosure.

FIG. 1 is a three-dimensional exploded view of an embodiment of a moiré pattern imaging device according to the instant disclosure. As shown in FIG. 1, a moiré pattern imaging device 1 in this embodiment of the instant disclosure includes a light-transmissive film 10 and a light-shielding film 20. The moiré pattern imaging device 1 is applicable to lens modules of various electronic products (such as smartphones, tablet computers, notebook computers, digital cameras, or lighting devices).

As shown in FIG. 1, the light-transmissive film 10 includes an imaging unit array A1, and the light-shielding film 20 includes a light-transmissive array A2. The imaging unit array A1 may correspond to the light-transmissive array A2 to form a moiré pattern to generate an image magnification effect. For example, the imaging unit array A1 and the light-transmissive array A2 may generate the moiré pattern effect in different manners such as different arrangement periods, configuration of a specific included angle, or a relative motion, which are respectively described in detail as follows.

As shown in FIG. 1, the light-transmissive film 10 is a film or a sheet made of a light-transmissive material. For example, the light-transmissive material may be polycarbonate (PC), acrylic plastic (PMMA), or other light-transmissive materials. A thickness of the light-transmissive film 10 may be, but is not limited to, between 5 µm and 1000 µm, and the light-transmissive film 10 includes two opposite surfaces (a light-incident surface 11 and a light-emergent surface 12). The light-incident surface 11 is configured to receive a ray of light (for example, object light) from the outside, and the ray of light exits through the light-emergent surface 12. In addition, in this embodiment, a plurality of imaging units 13 are disposed on the light-incident surface 11. The plurality of imaging units 13 are arranged on the light-incident surface 11 in two dimensions to form the above imaging unit array A1. In some embodiments, the plurality of imaging units 13 may also be disposed on the light-emergent surface 12 or on both of the light-incident surface 11 and the light-emergent surface 12.

In some embodiments, the above imaging units 13 each may be a microlens to form the imaging unit array A1 as a microlens array, or the imaging units 13 each may be a metalens to form the imaging unit array A1 as a metalens array, thereby generating a better imaging effect. However, the above embodiment is merely an example, and the imaging units 13 each may also be other optical elements, such as a holographic optical element (HOE), a diffractive optical element (DOE), a Fresnel lens, a pinhole, or the like.

In some embodiments, a size of each of the imaging units 13 of the above imaging unit array A1 may be between 2 µm and 2000 µm. Each of the imaging units 13 may be made of a transparent material, such as fused silica, optical glass, transparent plastic, or the like. Each of the imaging units 13 may be various of optical lenses such as a cylindrical lens, a convex lens, a concave lens, or the like. For example, in the embodiment of FIG. 1, each of the imaging units 13 is in a shape of a convex lens protruding out of the light-incident surface 11. The plurality of imaging units 13 of the imaging unit array A1 have first arrangement periods L1. The first arrangement periods L1 each may be a distance between centers of two adjacent ones of the imaging units 13. In some embodiments, the first arrangement periods L1 each may be between 2 µm and 2000 µm, which is not limited. The plurality of imaging units 13 of the imaging unit array A1 may be manufactured integrally with the light-transmissive film 10, or may be formed on the light-incident surface 11 in other processing manners such as screen printing, relief casting, photoresist reflow, micro-injection molding, hot embossing, or the like.

As shown in FIG. 1, the light-shielding film 20 may be a film or sheet made of a semi-light-transmissive material or a light-proof material to form a semi-light-shielding film or a full-light-shielding film. For example, the light-shielding film 20 may be made of dark plastic (such as black or brown plastic), such as polyester (PET), polyethylene (PE), polypropylene (PP), acrylic, or the like, so that the light-shielding film 20 has a semi-light-shielding effect. Alternatively, the light-shielding film 20 may also be made of a completely light-proof material such as metal or rubber, so that the light-shielding film 20 has a full-light-shielding effect.

As shown in FIG. 1, the light-shielding film 20 includes a plurality of light-transmissive regions 21. The plurality of light-transmissive regions 21 are arranged in two dimensions to form a light-transmissive array A2. The light-transmissive regions 21 each are a partial region through which light directly can penetrate without a light-shielding effect. In this embodiment, each of the light-transmissive regions 21 is a hole extending through two opposite surfaces of the light-shielding film 20. The light-transmissive regions 21 each may be a square (as shown in FIG. 1), a circle, an ellipse, or other irregular shapes, which is not limited. However, the above embodiment is merely an example. In some embodiments, the light-shielding film 20 may also be partially made of a light-transmissive material to form the plurality of light-transmissive regions 21, rather than being limited to holes.

In some embodiments, a width of each of the light-transmissive regions 21 of the above light-transmissive array A2 may be between 2 µm and 2000 µm. The plurality of light-transmissive regions 21 of the light-transmissive array A2 have second arrangement periods L2. The second arrangement periods L2 each may be a distance between centers of two adjacent ones of light-transmissive regions 21. In some embodiments, the second arrangement periods L2 each may be between 2 µm and 2000 µm, which is not limited.

The above thickness ranges, size ranges, or arrangement period ranges of the light-transmissive film 10 and the light-shielding film 20 are merely examples, and are not actually limited thereto. The ranges depend on products to which the moiré pattern imaging device 1 is applicable.

Figure 2:
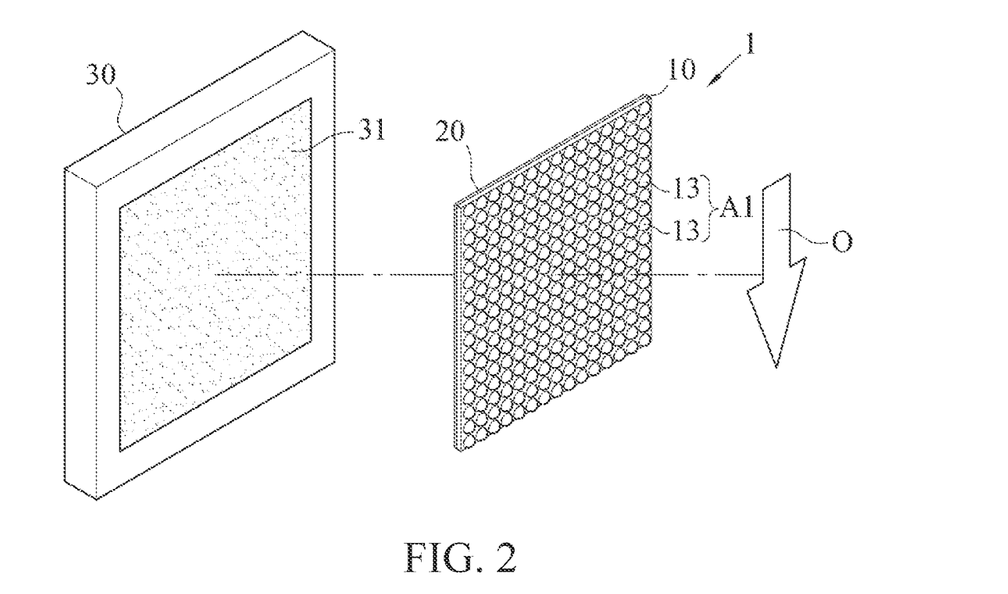
FIG. 2 illustrates a three-dimensional configuration diagram of an embodiment of the moiré pattern imaging device according to the instant disclosure.
Figure 3:
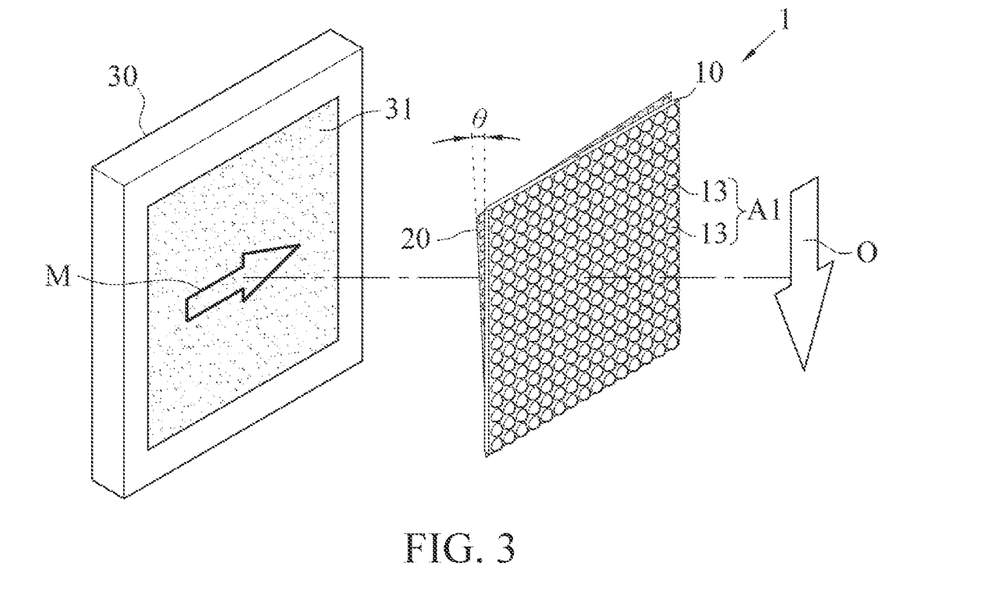
FIG. 3 illustrates a three-dimensional imaging diagram of an embodiment of the moiré pattern imaging device according to the instant disclosure.
Figure 4:
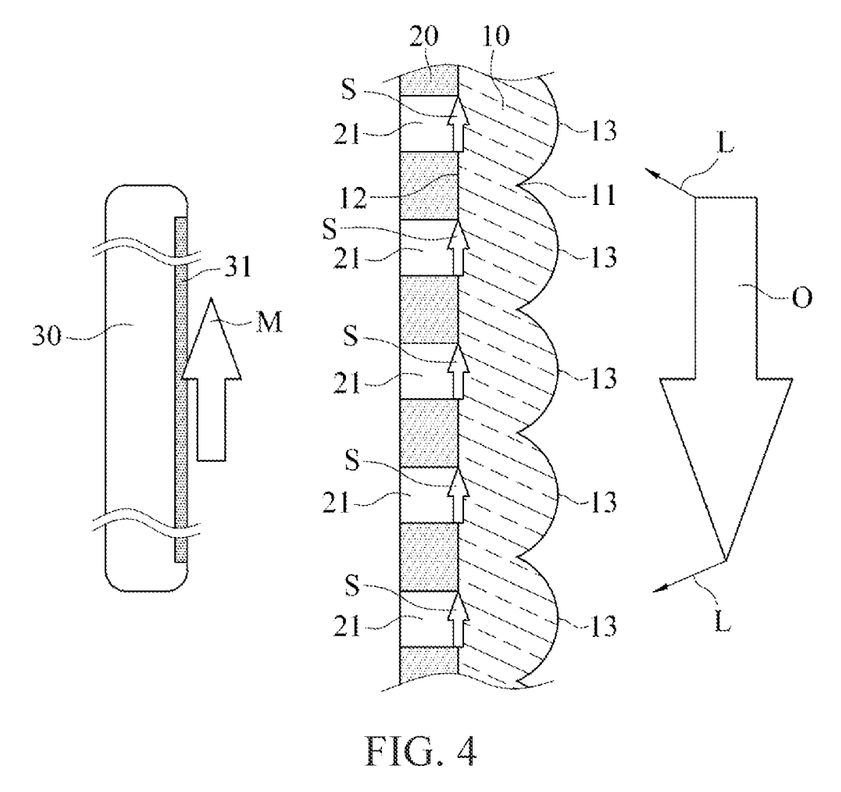
FIG. 4 illustrates a planar imaging diagram of an embodiment of the moiré pattern imaging device according to the instant disclosure.

FIG. 2 is a three-dimensional configuration diagram of an embodiment of the moiré pattern imaging device according to the instant disclosure. FIG. 3 is a three-dimensional imaging diagram of an embodiment of the moiré pattern imaging device according to the instant disclosure. FIG. 4 is a planar imaging diagram of an embodiment of the moiré pattern imaging device according to the instant disclosure. As shown in FIG. 1 to FIG. 3, the light-transmissive film 10 and the light-shielding film 20 may be overlaid on each other. For example, the light-shielding film 20 may be overlaid on the light-incident surface 11 or the light-emergent surface 12 of the light-transmissive film 10, so that the imaging unit array A1 on the light-transmissive film 10 corresponds to the light-transmissive array A2 on the light-shielding film 20. For example, in this embodiment, the light-transmissive film 10 and the light-shielding film 20 have the same size and are coaxially overlaid on each other, so that the imaging unit array A1 and the light-transmissive array A2 coaxially correspond to each other.

As shown in FIG. 3, the light-transmissive film 10 and the light-shielding film 20 may be overlaid and then a specific angle θ may be formed therebetween, so that a moiré pattern is generated between the imaging unit array A1 and the light-transmissive array A2, thereby generating an image magnification effect. Details are as follows.

As shown in FIG. 1 to FIG. 4, in this embodiment, the moiré pattern imaging device 1 includes a light sensor 30, and the light sensor 30 has a light-receiving region 31. The light sensor 30 is disposed such that the light-receiving region 31 faces the light-emergent surface 12 of the light-transmissive film 10. The light-receiving region 31 may be attached to or spaced apart from the light-shielding film 20, which is not limited. In some embodiments, the light sensor 30 may be specifically a photosensitive element, such as a charge-coupled device (CCD), a complementary metal-oxide semiconductor (CMOS), or a complementary metal-oxide semiconductor active pixel sensor (CMOS active pixel sensor).

As shown in FIG. 1 to FIG. 4, in this embodiment, centers of the imaging units 13 of the light-transmissive film 10 and centers of the light-transmissive regions 21 of the light-shielding film 20 correspond to each other in a one-to-one manner, so that the first arrangement periods L1 of the plurality of imaging units 13 are the same as the second arrangement periods L2 of the plurality of light-transmissive regions 21.

Based on the above, during image capture or acquisition of the moiré pattern imaging device 1, object light L generated by an external object O can enter the light-transmissive film 10 through the light-incident surface 11 of the light-transmissive film 10. Since the plurality of imaging units 13 are disposed on the light-incident surface 11, which respectively correspond to the plurality of light-transmissive regions 21, a plurality of tiny images S corresponding to the external object O are formed at the light-emergent surface 12 of the light-transmissive film 10 (or an imaging position of each of the imaging units 13). The plurality of tiny images S respectively correspond to the plurality of imaging units 13 and the plurality of light-transmissive regions 21. As shown in FIG. 1 and FIG. 3, a specific angle θ (such as ±0.1°, ±1°, or ±2°) may be directly formed after the imaging unit array A1 is overlaid on the light-transmissive array A2, so that a moiré pattern effect is generated between the imaging unit array A1 of the light-transmissive film 10 and the light-transmissive array A2 of the light-shielding film 20. In this way, when the object light L is transferred to the light-receiving region 31 of the light sensor 30 through the light-transmissive film 10 and the light-shielding film 20, the tiny image S generated by one of the imaging units 13 can be magnified and imaged on the light sensor 30 through the moiré pattern effect, thereby forming a moiré pattern magnification image M corresponding to the external object O on the light sensor 30.

In some embodiments, the light-transmissive film 10 and the light-shielding film 20 may also perform a relative motion (such as rotating, moving away, or approaching) to cause the imaging unit array A1 to correspond to the light-transmissive array A2 to form a moiré pattern effect, thereby generating an image magnification effect.

Figure 9:
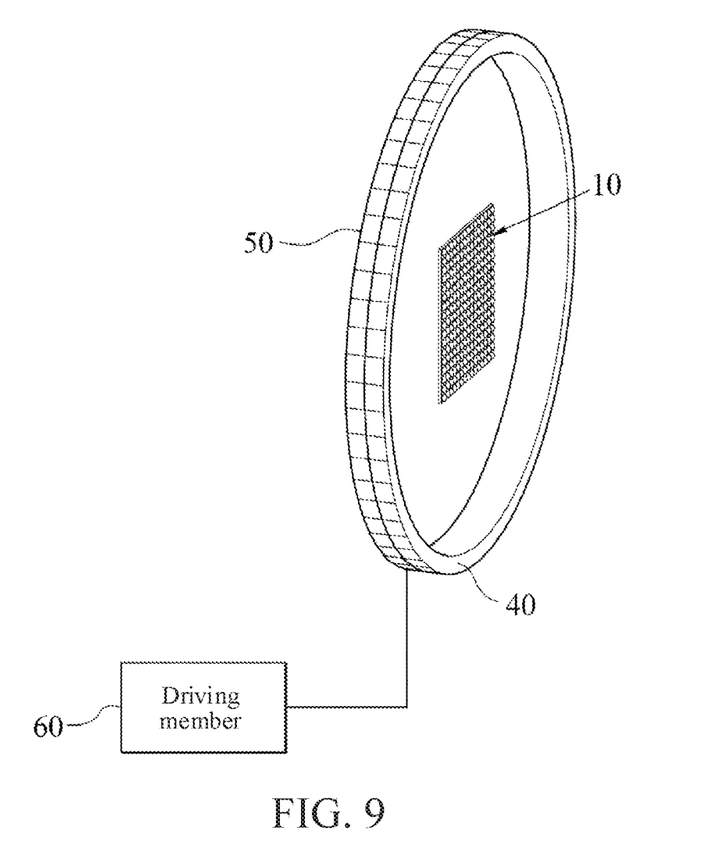
FIG. 9 illustrates a three-dimensional view of another embodiment of the moiré pattern imaging device according to the instant disclosure.
Figure 10:
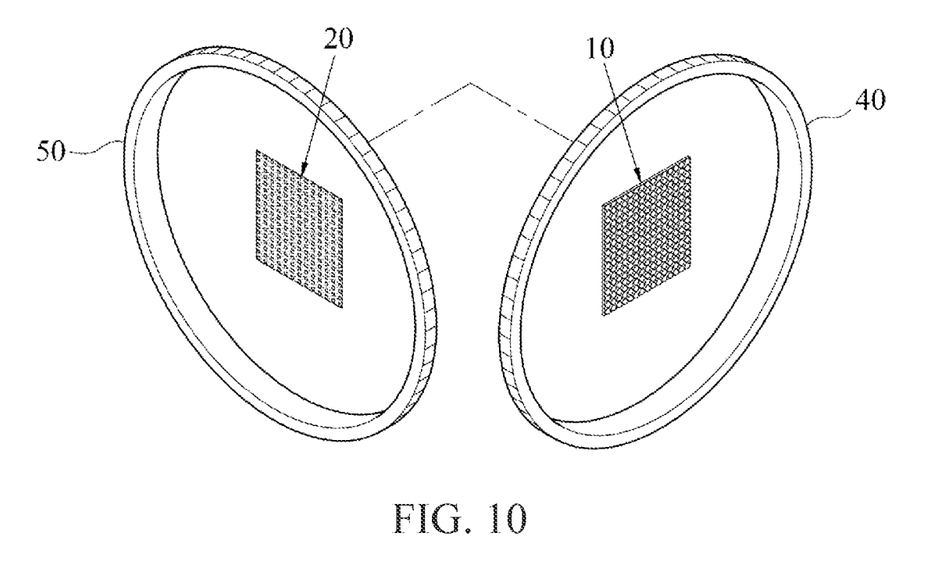
FIG. 10 illustrates a three-dimensional exploded view of another embodiment of the moiré pattern imaging device according to the instant disclosure.

For example, the light-transmissive film 10 and the light-shielding film 20 may move relative to each other through mechanical driving. As shown in FIG. 9 and FIG. 10, the moiré pattern imaging device 1 may include a first carrier 40, a second carrier 50, and a driving member 60. The first carrier 40 carries the light-transmissive film 10, and the second carrier 50 carries the light-shielding film 20. The first carrier 40 is any carrier capable of carrying the light-transmissive film 10, and the second carrier 50 is any carrier capable of carrying the light-shielding film 20. The driving member 60 is connected to the first carrier 40 or the second carrier 50, and the driving member 60 is capable of driving the first carrier 40 or the second carrier 50 to drive the light-transmissive film 10 and the light-shielding film 20 to move relative to each other. In some embodiments, the driving member 60 may include a driving motor, and a corresponding transmission mechanism may be disposed between the driving member 60 and the first carrier 40 or the second carrier 50. For example, the transmission mechanism is a gear transmission mechanism, a worm gear mechanism, or a cam mechanism and is connected to the driving motor to drive, through the driving motor and the transmission mechanism, the first carrier 40 or the second carrier 50 to operate, thereby driving the light-transmissive film 10 and the light-shielding film 20 to perform a relative motion.

For example, as shown in FIG. 3, the driving member 60 is capable of driving the light-transmissive film 10 and the light-shielding film 20 to rotate relative to each other, so that the light-transmissive film 10 is disposed at the above specific angle θ to the light-shielding film 20. In addition, the driving member 60 is capable of further driving the light-transmissive film 10 and the light-shielding film 20 to rotate relative to each other to adjust the specific angle θ to generate imaging effects with different magnifications.

In some embodiments, the first arrangement periods L1 of the plurality of imaging units 13 of the light-transmissive film 10 and the second arrangement periods L2 of the plurality of light-transmissive regions 21 of the light-shielding film 20 may also be different from each other.

Thus, according to the moiré pattern imaging device 1 in this embodiment of the instant disclosure, the imaging unit array A1 is disposed on the light-transmissive film 10 and the light-transmissive array A2 is disposed on the light-shielding film 20, and a moiré pattern effect can be generated between the imaging unit array A1 of the light-transmissive film 10 and the light-transmissive array A2 of the light-shielding film 20, thereby achieving an image magnification effect. In this way, the moiré pattern imaging device 1 may be overall designed to be much thinner than current optical lens modules on the market. For example, thicknesses of the light-transmissive film 10 and the light-shielding film 20 may respectively range from 5 μm to 1000 μm. The thickness ranges of the light-transmissive film 10 and the light-shielding film 20 are merely examples, which actually depend on products to which the moiré pattern imaging device 1 is applicable.

Figure 5:
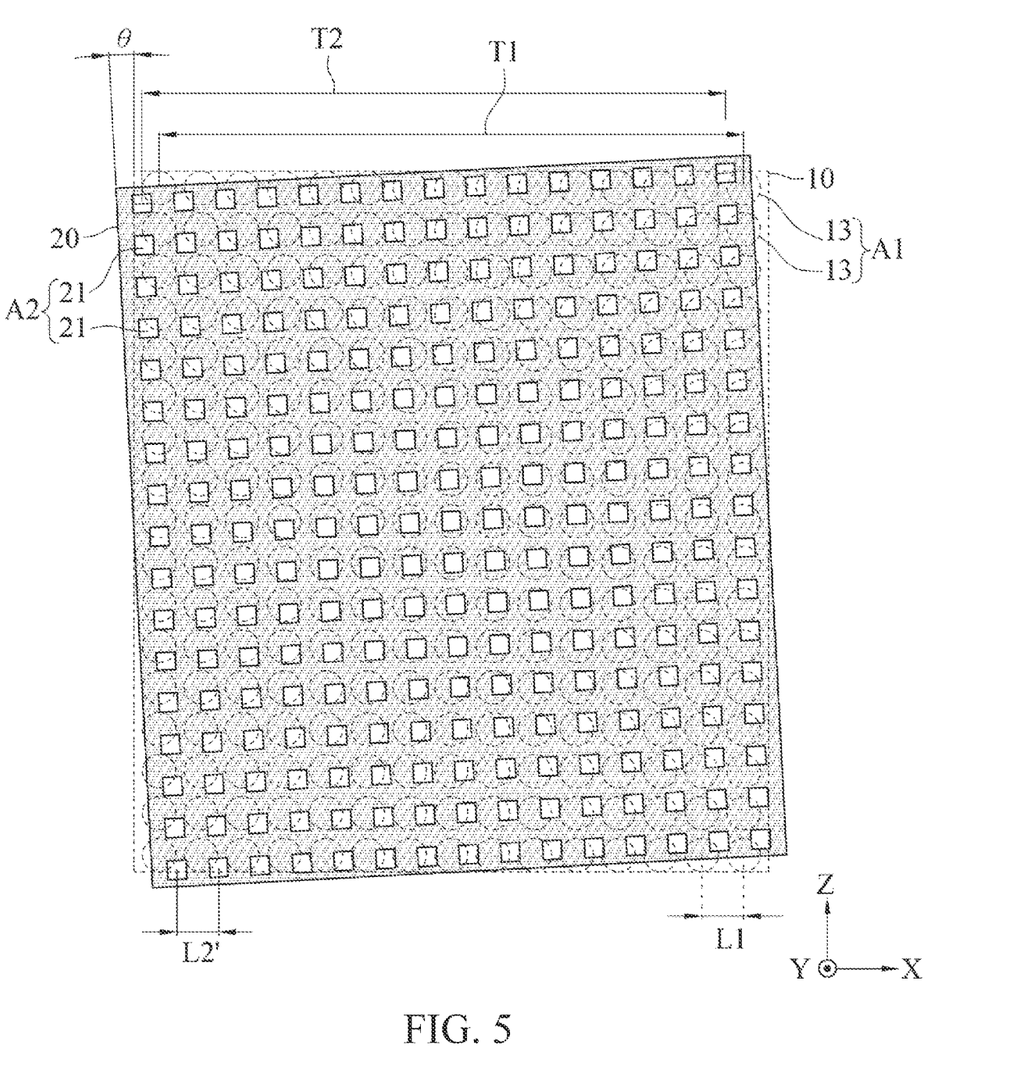
FIG. 5 illustrates a schematic diagram of a period difference of an embodiment of the moiré pattern imaging device according to the instant disclosure.

In some embodiments, the specific angle θ between the imaging unit array A1 and the light-transmissive array A2 can result in a period difference between the imaging unit array A1 and the light-transmissive array A2, and the period difference is less than the arrangement periods of the plurality of light-transmissive regions 21 of the light-transmissive array A2. For example, as shown in FIG. 1 and FIG. 2, before rotation of the light-transmissive film 10 or the light-shielding film 20, the first arrangement periods L1 of the plurality of imaging units 13 of the imaging unit array A1 are the same as the second arrangement periods L2 of the plurality of light-transmissive regions 21 of the light-transmissive array A2. Therefore, a sum of a plurality of first arrangement periods L1 of the imaging unit array A1 in a uniaxial direction (which is an X-axis direction herein but may also be a Y-axis direction) is equal to a sum of a plurality of first arrangement periods L2 of the light-transmissive array A2 in a uniaxial direction (which is an X-axis direction herein but may also be a Y-axis direction). Next, as shown in FIG. 1, FIG. 3, and FIG. 5, when the light-transmissive film 10 and the light-shielding film 20 rotate relative to each other (the light-shielding film 20 rotates herein) to generate the specific angle θ between the imaging unit array A1 and the light-transmissive array A2, the first arrangement periods L1 of the plurality of imaging units 13 of the imaging unit array A1 in the uniaxial direction (which is an X-axis direction herein) are different from second arrangement periods L2' of the plurality of light-transmissive regions 21 of the light-transmissive array A2 in the uniaxial direction (which is an X-axis direction herein), that is, the distance between the centers of the two adjacent ones of the light-transmissive regions 21 is smaller (that is, the second arrangement periods L2' are less than the second arrangement periods L2 in FIG. 1) after rotation of the light-shielding film 20. Therefore, a period sum T1 of the plurality of first arrangement periods L1 of the imaging unit array A1 are different from a period sum T2 of the plurality of second arrangement periods L2' of the light-transmissive regions 21 (the period sum T2 is less than the period sum T1 herein). The above period difference may be a difference between the period sum T1 and the period sum T2. The period difference is less than the second arrangement periods L2 of the light-transmissive array A2 or the first arrangement periods L1 of the imaging unit array A1, so that a moiré pattern effect is formed between the imaging unit array A1 and the light-transmissive array A2, thereby generating a relatively good image magnification effect.

Figure 6:
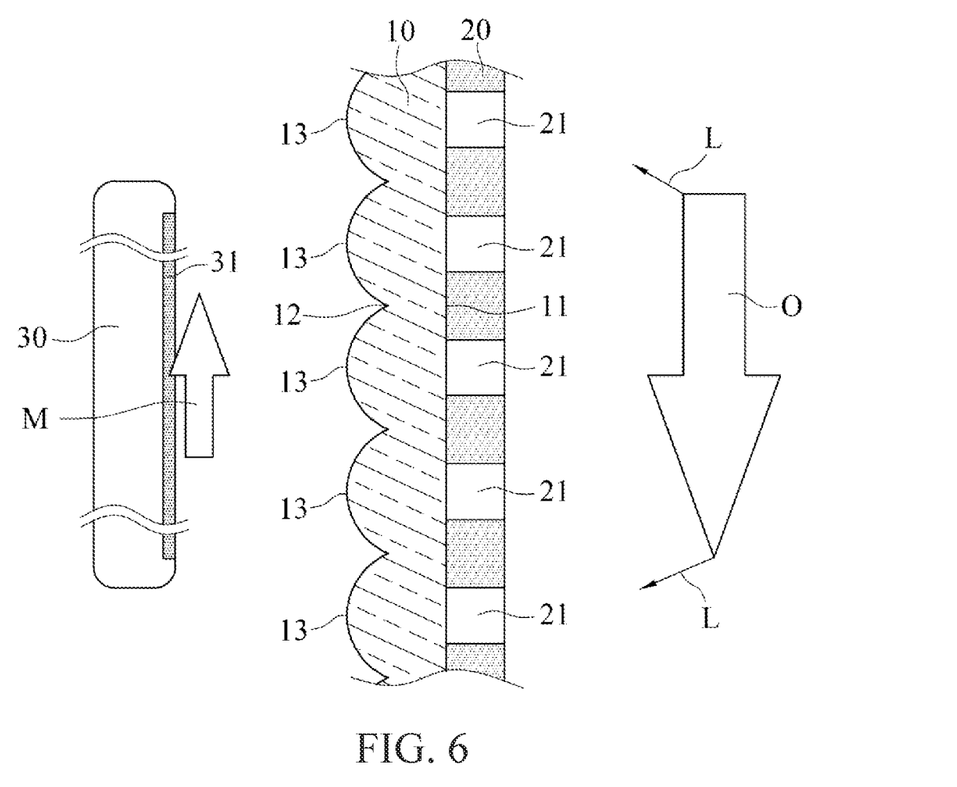
FIG. 6 illustrates a planar imaging diagram of another embodiment of the moiré pattern imaging device according to the instant disclosure.

FIG. 6 is a planar imaging diagram of another embodiment of the moiré pattern imaging device according to the instant disclosure. In another embodiment, the light-shielding film 20 may also be overlaid on the light-incident surface 11 of the light-transmissive film 10, so that the light-transmissive film 10 is located between the light sensor 30 and the light-shielding film 20. In this way, the object light L generated by the external object O first passes through the light-shielding film 20 and then enters the light-transmissive film 10 through the light-incident surface 11, so that stray light can be filtered out through the light-shielding film 20 in advance, thereby achieving a better imaging effect.

Figure 7:
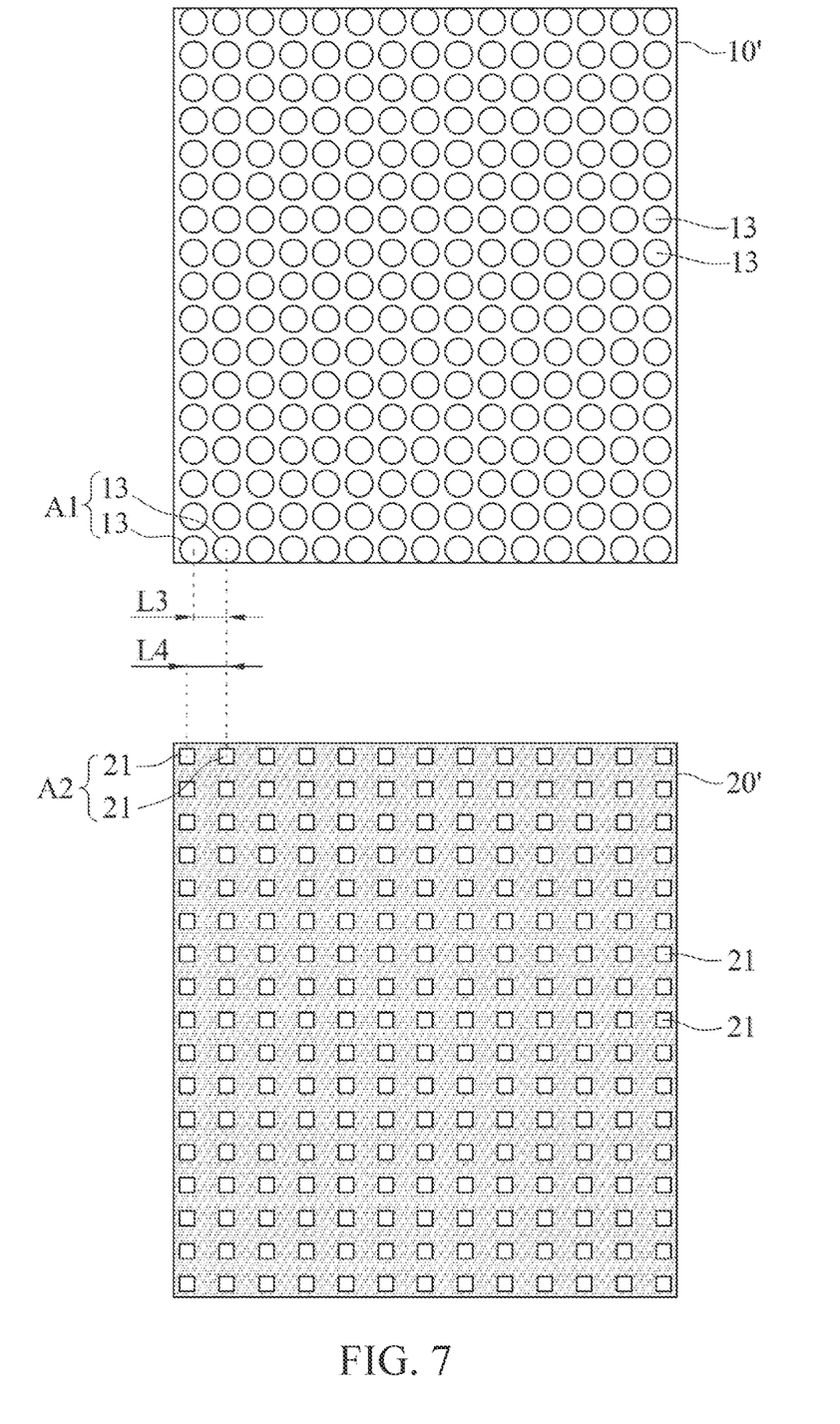
FIG. 7 illustrates a schematic diagram of a period difference of another embodiment of the moiré pattern imaging device according to the instant disclosure.
Figure 8:
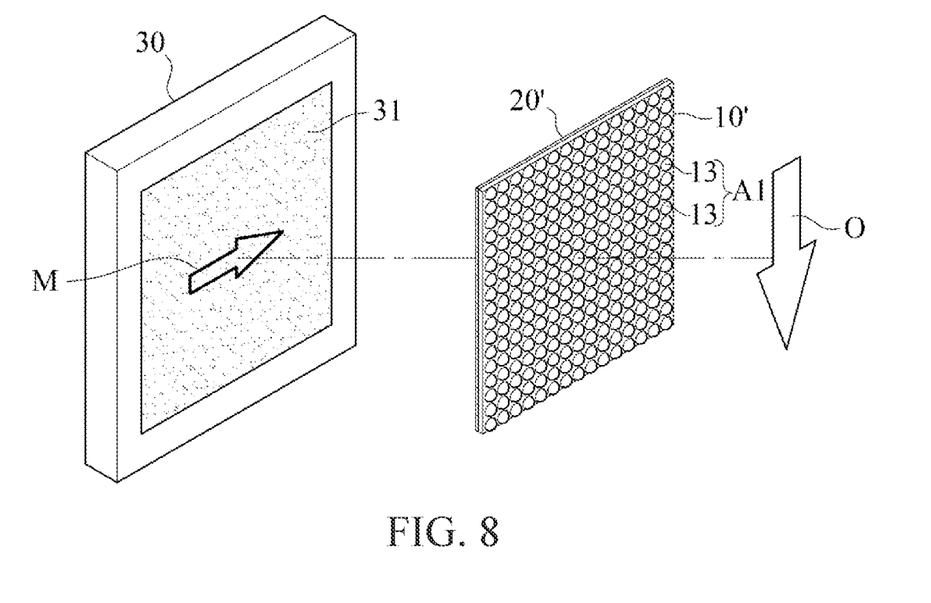
FIG. 8 illustrates a three-dimensional imaging diagram corresponding to FIG. 7.

FIG. 7 and FIG. 8 are respectively a schematic diagram of a period difference and a three-dimensional imaging diagram of another embodiment of the moiré pattern imaging device according to the instant disclosure. A difference between this embodiment and the embodiment of FIG. 1 lies in at least that, in this embodiment, first arrangement periods L3 of a plurality of imaging units 13 of an imaging unit array A1 on a light-transmissive film 10' are different from second arrangement periods L4 of a plurality of light-transmissive regions 21 of a light-transmissive array A2 on a light-shielding film 20'. For example, in this embodiment, the second arrangement periods L4 are greater than the first arrangement periods L3, which is not limited. Alternatively, the second arrangement periods L4 may be less than the first arrangement periods L3. Thus, as shown in FIG. 8, since the first arrangement periods L3 are different from the second arrangement periods L4, a moiré pattern effect can be generated without a need to configure a specific angle θ or to perform a relative motion between the imaging unit array A1 and the light-transmissive array A2. In this way, a moiré pattern magnification image M with a fixed magnification corresponding to the external object O is generated on the light sensor 30, so that configurations of the carrier and the driving member are omitted, thereby further reducing costs.

In conclusion, according to the moiré pattern imaging device in the embodiments of the instant disclosure, the imaging unit array is disposed on the light-transmissive film and the light-transmissive array is disposed on the light-shielding film, and a moiré pattern effect can be generated between the imaging unit array of the light-transmissive film and the light-transmissive array of the light-shielding film, thereby achieving an image magnification effect. In this way, the moiré pattern imaging device may be overall designed to be much thinner than current optical lens modules on the market.

What is claimed is:

1. A moiré pattern imaging device, comprising:
   a light-transmissive film comprising a plurality of imaging units and a light-incident surface and a light-emergent surface opposite to each other, wherein the plurality of imaging units are disposed on the light-incident surface, the light-emergent surface, or a combination thereof and are arranged in two dimensions to form an imaging unit array;
   a light-shielding film comprising a plurality of light-transmissive regions, wherein the light-transmissive regions are arranged in two dimensions to form a light-transmissive array, and the light-shielding film is overlaid on the light-incident surface or the light-emergent surface, wherein the light-transmissive array corresponds to the imaging unit array; and
   a first carrier, a second carrier, and a driving member; wherein
   the imaging unit array and the light-transmissive array together form a moiré pattern effect to generate an image magnification effect;
   the light-transmissive film and the light-shielding film perform a relative motion, so that the imaging unit array and the light-transmissive array together form the moiré pattern effect; and
   the first carrier carries the light-transmissive film, the second carrier carries the light-shielding film, and the driving member is connected to the first carrier or the second carrier and is capable of driving the first carrier or the second carrier to drive the light-transmissive film and the light-shielding film to perform the relative motion.

2. The moiré pattern imaging device according to claim 1, wherein each of the light-transmissive regions is a hole extending through two opposite surfaces of the light-shielding film.

3. The moiré pattern imaging device according to claim 1, wherein the light-shielding film is a semi-light-shielding film.

4. The moiré pattern imaging device according to claim 1, further comprising: a light sensor having a light-receiving region, wherein the light sensor is disposed such that the light-receiving region faces the light-emergent surface of the light-transmissive film.

5. The moiré pattern imaging device according to claim 4, wherein the light-transmissive film is located between the light sensor and the light-shielding film, and the light-shielding film is overlaid on the light-incident surface of the light-transmissive film.

6. The moiré pattern imaging device according to claim 1, wherein the imaging unit array is disposed at a specific angle to the light-transmissive array.

7. The moiré pattern imaging device according to claim 6, wherein the specific angle results in a period difference between the imaging unit array and the light-transmissive array, wherein the period difference is less than an arrangement period of the plurality of light-transmissive regions of the light-transmissive array, wherein the arrangement period is a distance between centers of two adjacent ones of the light-transmissive regions.

8. The moiré pattern imaging device according to claim 1, wherein the plurality of imaging units of the imaging unit array have a first arrangement period, and the plurality of light-transmissive regions of the light-transmissive array have a second arrangement period, wherein the first arrangement period is the same as the second arrangement period, and the relative motion is a rotational motion.

9. The moiré pattern imaging device according to claim 1, wherein the plurality of imaging units of the imaging unit array have a first arrangement period, and the plurality of light-transmissive regions of the light-transmissive array have a second arrangement period, wherein the first arrangement period is different from the second arrangement period.

10. The moiré pattern imaging device according to claim 1, wherein each of the imaging units is a microlens, a metalens, a holographic optical element, a diffractive optical element, a Fresnel lens, or a pinhole.

* * * * *